US008563942B2

(12) United States Patent
Platzgummer

(10) Patent No.: US 8,563,942 B2
(45) Date of Patent: Oct. 22, 2013

(54) MULTI-BEAM DEFLECTOR ARRAY MEANS WITH BONDED ELECTRODES

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 507 days.

(21) Appl. No.: 12/780,551

(22) Filed: May 14, 2010

(65) Prior Publication Data
US 2010/0288938 A1 Nov. 18, 2010

(30) Foreign Application Priority Data
May 14, 2009 (EP) .................................... 09006523

(51) Int. Cl.
 *G01T 1/08* (2006.01)
 *H01J 3/14* (2006.01)
(52) U.S. Cl.
 USPC ....................................... 250/396 R; 438/128
(58) Field of Classification Search
 USPC ............. 250/396 R; 438/479, 584, 587, 608
 See application file for complete search history.

(56) References Cited

U.S. PATENT DOCUMENTS

| | | | | |
|---|---|---|---|---|
| 5,369,282 A | * | 11/1994 | Arai et al. ................ | 250/492.22 |
| 5,814,423 A | * | 9/1998 | Maruyama et al. ............... | 430/5 |
| 6,014,200 A | | 1/2000 | Sogard et al. | |
| 6,965,153 B1 | | 11/2005 | Ono et al. | |
| 8,198,601 B2 | * | 6/2012 | Platzgummer et al. ... | 250/396 R |
| 2004/0119021 A1 | * | 6/2004 | Parker et al. ............. | 250/396 R |
| 2004/0157407 A1 | | 8/2004 | Tong et al. | |
| 2004/0169147 A1 | | 9/2004 | Ono et al. | |
| 2008/0128638 A1 | | 6/2008 | Doering et al. | |
| 2008/0203317 A1 | | 8/2008 | Platzgummer et al. | |
| 2008/0283767 A1 | * | 11/2008 | Platzgummer ............ | 250/396 R |
| 2009/0032700 A1 | * | 2/2009 | Park et al. ..................... | 250/282 |

OTHER PUBLICATIONS

European Search Report for European Application 10450070.7 dated May 7, 2012, 13 pgs.

* cited by examiner

*Primary Examiner* — David A Vanore
*Assistant Examiner* — Brooke Purinton
(74) *Attorney, Agent, or Firm* — KPPB LLP

(57) ABSTRACT

The invention relates to a multi-beam deflector array means for use in a particle-beam exposure apparatus employing a beam of charged particles, said multi-beam deflector array means having an overall plate-like shape with a membrane region and a buried CMOS-layer, said membrane region comprising a first side facing towards the incoming beam of particles and a second side opposite to the first side, an array of apertures, each aperture allowing passage of a corresponding beam element formed out of said beam of particles, and an array of electrodes, each aperture being associated with at least one of said electrodes and the electrodes being controlled via said CMOS layer, wherein the electrodes are pillared, standing proud of the main body of the multi-beam deflector array means, the electrodes being connected to one side of the main body of the multi-beam deflector array means by means of bonding connections.

16 Claims, 5 Drawing Sheets

US 8,563,942 B2

MULTI-BEAM DEFLECTOR ARRAY MEANS WITH BONDED ELECTRODES

RELATED APPLICATION

This application claims priority under 35 U.S.C. §119 to European Patent Application No. 09006523.6 filed May 14, 2009, the disclosure of which is incorporated by reference herein in its entirety.

FIELD OF THE INVENTION AND DESCRIPTION OF PRIOR ART

The present invention relates to a multi-beam deflector array means for use in a particle-beam exposure apparatus employing a beam of charged particles, said multi-beam deflector array means comprising a main body of overall plate-like shape having a membrane region and a buried CMOS-layer, said membrane region comprising a first side facing towards the incoming beam of particles and a second side opposite to the first side, an array of apertures, each aperture allowing passage of a corresponding beam element formed out of said beam of particles, and an array of electrodes, each aperture being associated with at least one of said electrodes and the electrodes being controlled via said CMOS layer.

In such a particle-beam exposure apparatus a particle beam is generated by an illumination system and illuminates a pattern definition (PD) means. The PD means has an array of apertures which define a beam pattern to be projected on a target surface.

Applications of a particle beam exposure apparatus of this kind range from the field of nano-scale patterning, e.g., by direct ion beam material modification or by electron or ion beam induced etching and/or deposition, to the field of maskless particle-beam lithography.

In maskless particle-beam lithography, a desired pattern is defined on a substrate surface. This is done by covering the substrate surface with a layer of radiation-sensitive resist and exposing a desired structure on the resist which is then developed. The developed resist is used as a mask for further structuring processes such as reactive etching and the like.

U.S. Pat. No. 6,768,125 and U.S. Pat. No. 7,084,411 by the applicant/assignee present a multi-beam maskless lithography concept, dubbed PML2 (short for 'Projection Mask-Less Lithography #2'), that employs a PD device comprising a number of plates stacked on top of the other for use in a lithography apparatus. The PD device comprises at least two different plates, namely an aperture plate and a deflector array plate. These plates are mounted together at defined distances, for instance in a casing.

The aperture plate has a plurality of apertures used to define beamlets permeating the PD device. The deflector array plate has a plurality of openings, each opening corresponding to an aperture of the aperture plate, and is used to individually blank out selected beamlets ('blanking plate'). Each blanking opening is provided with a beamlet deflection means, e.g., electrodes, that can be controlled by a blanking signal between two deflection states, namely, a first state ('switched on') and a second state ('switched off'). In the first state, the electrodes have assumed a state in which particles passing through the opening are allowed to travel along a desired path. In the second state the electrodes are deflecting particles transmitted through the opening off said path, preferably towards some absorbing surface within the lithography apparatus.

Another function, absorbing the majority of heat load imposed by the incoming beam, may be provided by a specific 'cover plate' or included in the aperture plate which is then placed as a first plate as seen along the direction of the beam.

Each of the plates is preferably realized as a semiconductor (in particular silicon) wafer in which the structures have been formed by micro-structuring techniques known in the art.

The deflection means comprise a set of beam blanking electrodes, the set preferably consisting of two electrodes. U.S. Patent Publication No. 2005/0242302 A1 of the applicant/assignee proposes to form the electrodes around the blanking openings by perpendicular growth employing state-of-the-art electroplating techniques.

U.S. Patent Publication No. 2008/0203317 A1 of the applicant/assignee discloses, among other things, a deflector array plate ('blanking plate') with a plurality of apertures, wherein each aperture is associated with one depression which is formed in one of the sides of the blanking plate. Each aperture is associated with at least one electrode, the electrodes being located in the depression around the aperture and not protruding over the surface of the side of the blanking plate where the depressions are formed. As a consequence, the electrodes which are energized for beam switching do not lead to any significant changes of the electrostatic field outside the depressions. The electrodes, depressions and apertures are structured by a suitable combination of lithographic processes known in the art.

EP 1 993 118 A2 describes a solution where a deflector array means has a plurality of electrostatic deflector electrodes for each beamlet. Counter electrodes are electrically connected to a counter potential independently of the deflection array means through a counter-electrode array means. The counter potentials may be a common ground potential or individual potentials. One implementation of said solution is to use one electroplated electrode on a CMOS wafer membrane with a multi-aperture array, and place another membrane with a second multi-aperture array, carrying the counter electrodes which have a uniform potential, above.

SUMMARY OF THE INVENTION

The present invention sets out to improve the solutions set forth in prior art.

This task is solved according to the invention by above-mentioned multi-beam deflector array means, wherein the electrodes are pillared, standing proud of the main body of the multi-beam deflector array means, the electrodes being connected to one side of the main body of the multi-beam deflector array means by means of bonding connections.

The solution according to the invention allows shielding of neighboring apertures from stray fields and, thus, reducing cross-talk between the apertures. The term "pillared" signifies that the electrodes are oriented vertically to the main body of the multi-beam deflector array means, bonded at their lower ends to the main body of the deflector array means. The electrodes are basically shaped like columns. Generally speaking, the lower end of the electrodes is the end that is oriented towards the main body. In the arrangement of FIG. 1, where the particle beam runs vertically downward and the electrodes are fixed to the first side of the main body of the multi-beam deflector array means, the lower ends of the electrodes are literally the low ends with regard to the arrangement of the electrodes. Consequently, the term "upper ends" of the electrodes refers to the ends of the electrodes facing towards the incoming beam (in FIG. 1) or the ends of the electrodes opposite to the lower ends.

In a preferred embodiment of the invention, indium is used to realize the bonding connection between the electrodes and the main body of the multi-beam deflector array means. Indium has the advantage of being soft and malleable and is frequently used in the semiconductor industry, although for different purposes like the sealing of bearings in production machines. Indium allows for a good conductive connection between the electrodes and the main body (and the CMOS-circuitry) of the multi-beam deflector array means and easy mounting of the electrodes. It is, however, possible to use other materials like copper-tin alloys, to name only one of many options known to one skilled in the art.

The electrodes are preferably made of silicon.

In another embodiment of the invention, the top area of the electrodes, "top" here signifying the end of the electrodes that is directed towards the main body of the multi-beam deflector array means, is larger than the area taken by the bonding connection. In other words, the area of the cross sectional area of the electrodes as taken parallel to the plane of the support plate is larger than the area occupied by the bonding connections. This means that the bonding material in the state of an established connection does not occupy the entire area of the top of the electrode to prevent the oozing out of the bonding material from the space between electrode and main body.

In yet another embodiment of the invention, protrusions (or: noses) are present on the outer boundary of the top area of the electrodes, a protrusion being an area that is elevated relative to the remaining area of the top of the electrodes. Elevated here means that the surface of the protrusion is closer to the surface of the main body than the remaining area of the top of the electrode. Metaphorically speaking, the top area of the electrode features at least one or more protrusions or may even be surrounded by a (continuous) ring of protrusions that are elevated relative to the rest of the top surface of the electrode.

These protrusions help to shield the beamlet transgressing the multi-beam deflector array means from stray fields that might emerge from the region close to the bonding connection. For instance, it is possible that the insulating layer surrounding the bonding connections gets charged by stray particles from the beamlet and thus influences the beamlet in return. Furthermore, the protrusions help to decrease cross-talk between neighboring apertures.

In a variant of abovementioned embodiment, the protrusions are restricted to the part of the top of the electrodes close to the respective apertures of the main body.

In yet another variant of this embodiment, an isolating coating is applied to the top of the protrusion.

This isolating coating might also be applied to the side of the main body facing towards the electrodes, the isolating coating being located at the places where the protrusions touch on the main body.

Advantageously, the isolating coating may be retracted from the side of the protrusion facing the respective aperture in the main body of the multi-beam deflector array means. Thus, the isolating coating is partly shielded from stray particles of the beamlet pervading the aperture in the main body and is not charged by such particles. The term retracted means, that the isolating coating is pulled back from the edge of the electrode with its protrusion.

In a favourable variant of the invention the electrodes may be free-standing and mechanically independent from each other. This means that no fixations are provided between the electrodes, like ligaments, connecting membranes and the like. The electrodes are not connected mechanically.

In one suitable aspect of the invention, a support plate is arranged on the side of the electrodes facing away from the membrane region, the support plate being connected with the electrodes and an insulating layer isolating the support plate from the electrodes, the support plate comprising an array of openings which correspond to the apertures of the membrane region. The support plate gives further stability to the system, fixing the electrodes in their position and protecting the part of the multi-beam deflector array means with the CMOS-layer from highly energetic impinging particles. The support plate further allows efficient shielding of stray fields which are generated by the deflecting electrodes during operation. The support plate is connected to the main body of the multi-beam deflector array means via the electrodes. Accurate alignment between the support plate and the main body of the multi-beam deflector array means is required. The insulating layer is essentially arranged on the lower end of the electrodes between the electrodes and the support plate. "Lower end" here signifies the ends of the electrodes being oriented towards the support plate. In an arrangement as depicted in FIG. 1, where the particle beam is oriented vertically downwards, the "lower end" is oriented towards the incoming particle beam. The insulating layer is preferably a high-resistance layer, with a resistance of around 1 MΩ, to reduce the power.

The diameter of the openings of the support plate is equal to or larger than the diameter of the apertures of the membrane region.

In yet another embodiment of the invention, the support plate acts as aperture plate (in addition to shielding and stability reasons) with the openings of the aperture plate exhibiting a smaller diameter than the subsequent apertures in the main body.

In such an arrangement, an upper part of the wall of the openings in the support plate may preferably have a smaller diameter than a lower part of the wall and the subsequent aperture in the main body. The aperture plate forms the beamlets out of the impinging broad beam of energetic charged particles. The combination of aperture plate and support plate allows for the saving of one additional plate to perform the beam-forming, renders the device more compact and facilitates installation of the multi-beam deflector array means into a particle-beam exposure apparatus, to name only one of different possible applications.

In a straightforward implementation of the invention, the electrodes are arranged on the first side of the main body of the multi-beam deflector array means. In another embodiment of the invention, the electrodes are arranged on the second side of the main body of the multi-beam deflector array means.

BRIEF DESCRIPTION OF THE DRAWINGS

In the following, the present invention is described in more detail with reference to the drawings, which schematically show.

DETAILED DESCRIPTION OF THE INVENTION

The preferred embodiment of the invention discussed in the following is a development for a PML2-type particle-beam exposure apparatus with a pattern definition (PD) system as disclosed in the U.S. Pat. No. 6,768,125 (=GB 2 389 454 A) of the assignee/applicant, and with a large-reduction projecting system. In the following, first the technical background of the apparatus is discussed—as far as relevant to the invention—, then the invention is presented in detail.

It should be appreciated that the invention is not restricted to the following embodiments or the particular layout of the PD-system, which merely represent one of the possible applications of the invention; the invention is suitable for other types of processing systems that employ a particle-beam with projector stages as well.

Maskless Charged Particle-Beam Processing Apparatus

Figure 1:
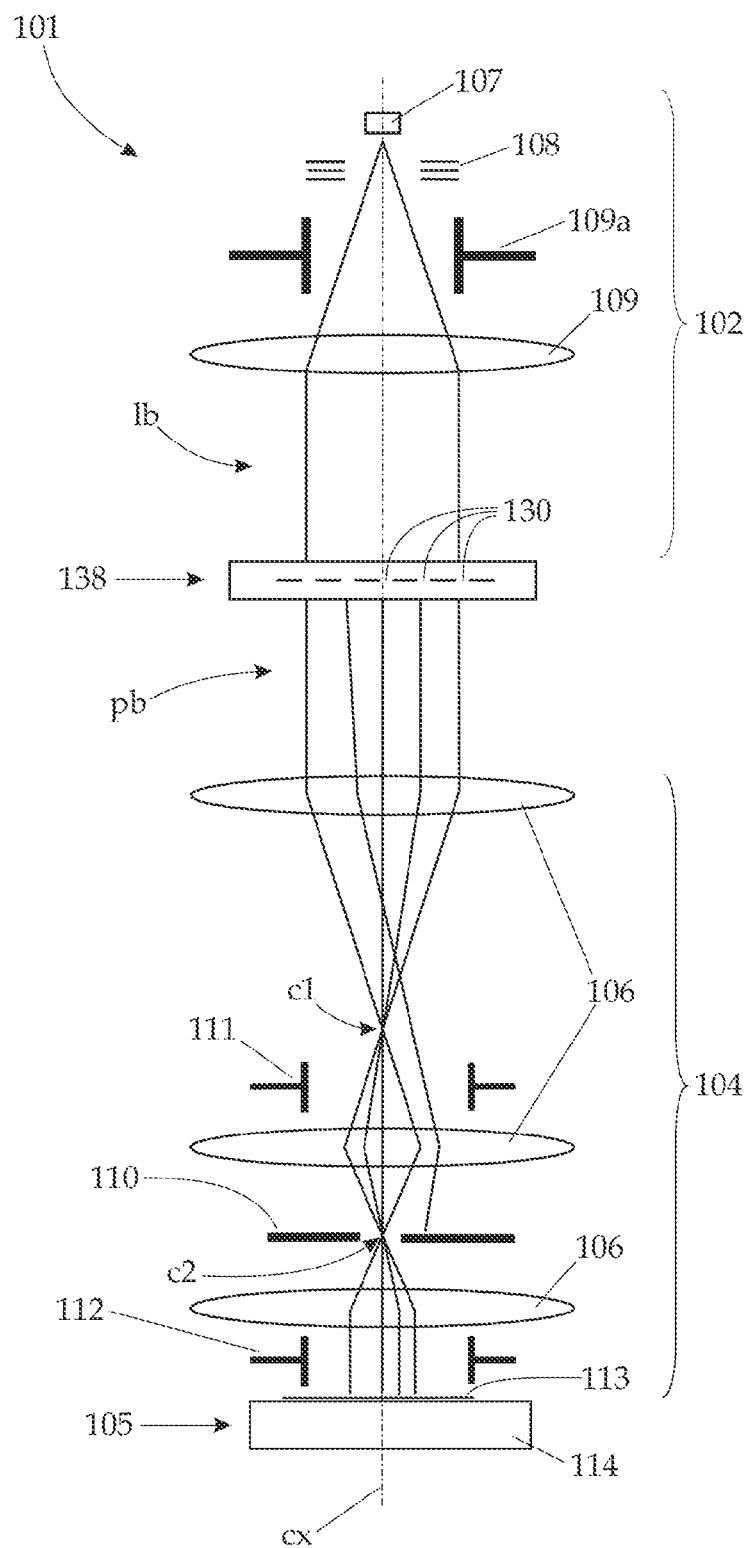
FIG. 1 is a schematic overview of a particle-beam exposure apparatus according to prior art in a longitudinal section, but suitable for the invention.

FIG. 1 shows a schematic overview of a maskless particle-beam processing apparatus PML2 which itself is known from prior art but is suitable to embody the present invention. The components are not shown to size; in particular, the lateral width of the particle beam lb, pb is exaggerated. In the following, only those details are given as needed to disclose the invention. For more details, the reader is referred to the U.S. Pat. Nos. 6,768,125 and 7,276,714 the disclosure of which is incorporated by reference herein in its entirety.

The main components of the lithography apparatus 101— corresponding to the direction of the lithography beam lb, pb which in this example runs vertically downward in FIG. 1—are an illumination system 102, a PD system 138, a projecting system 104 and a target station 105 with a substrate 113 which is held and positioned by a wafer stage 114. The whole apparatus is contained in a vacuum housing (not shown) held at a high vacuum to ensure an unimpeded propagation of the beam lb, pb along the optical axis cx of the apparatus. The optical systems (illumination system 102, projecting system 104) are realized using electrostatic or electromagnetic lenses which are depicted symbolically by reference numbers 106.

The illumination system 102 comprises, for instance, an electron gun 107, an extraction system 108 as well as a condenser lens system 109. A general blanking deflector 109a may be present as well. It should, however, be noted that in place of electrons, in general, other electrically charged particles can be used as well. Apart from electrons these can be, for instance, hydrogen ions or heavier ions, charged atom clusters, or charged molecules. In the context of this disclosure, "heavier ions" refer to ions of elements heavier than C, such as O, N, or the noble gases Ne, Ar, Kr, Xe.

By means of the condenser lens system 109, the particles emitted from the illumination system 102 are formed into a wide, substantially telecentric particle beam serving as lithography beam lb. The lithography beam lb then irradiates the PD system 138 which is held at a specific position in the path of the lithography beam lb. The PD system 138 comprises a number of plates with a plurality of openings and/or apertures 130, arranged in regular arrays, which define a beam pattern to be projected on the substrate 113.

Some of the apertures and/or openings are "switched on" or "open" so as to be transparent to the incident beam in the sense that they allow the portion of the beam (beamlet) that is transmitted through it to reach the target. The other apertures and/or openings are "switched off" or "closed", in the meaning that the corresponding beamlets cannot reach the target (even though they may leave the PD system and travel through some portion of the projecting system 104); effectively, these "switched off" apertures and/or openings are non-transparent (opaque) to the beam from the target's perspective.

As a consequence the lithography beam lb is structured into a patterned beam pb, emerging from the PD system 138. The pattern of switched on apertures and/or openings—the only portions of the PD system 138 which are transparent to the lithography beam lb—is chosen according to the pattern to be exposed on the substrate 113. It should be noted that the "switching on/off" of the beamlets usually is realized by a blanking means of a suitable kind provided in one of the plates of the PD system 138: "Switched off"-beamlets are deflected off their path (by very small angles) so they cannot reach the target but are merely absorbed somewhere in the lithography apparatus, e.g., by an absorbing plate 110. The beam deflection angle is largely exaggerated in FIG. 1; it is, in general, very small, typically 0.2 to 2 thousands of a radian.

In FIG. 1 only five beamlets of the patterned beam pb are shown as representatives for an actual large number of beamlets. One of the beamlets is switched off and is absorbed at the absorbing plate 110 while the other four beamlets are directed to the substrate 113 and there form images of the respective apertures 130.

In the embodiment shown in FIG. 1, the projection system 104 is composed of a number of consecutive particle-optical projector stages, consisting of electrostatic or electromagnetic lenses and other deflection means. These lenses and means are shown in symbolic form only, since their application is well known from prior art. The projection system 104 employs a demagnifying imaging through crossovers c1, c2. The demagnification factor for both stages is chosen such that an overall demagnification of several hundred results, e.g., 200× (FIG. 1 is not to scale). A demagnification of this order is particularly suitable with a lithography setup, in order to alleviate problems of miniaturization in the PD device.

In the whole projection system 104, provisions are made to extensively compensate the lenses and/or deflection means with respect to chromatic and geometric aberrations. As a means to shift the image laterally as a whole, i.e., along a direction perpendicular to the optical axis cx, deflection means 111, 112 are provided in the projection system 104. The deflection means can be realized as, for instance, a multipole electrode system which is either positioned near the crossover, as shown in FIG. 1 with the first deflection means 111, or after the final lens of the respective projector, as in the case with the second stage deflection means 112 in FIG. 1. In this apparatus, a multipole electrode is used as deflection means both for shifting the image in relation to the stage motion and for correction of the imaging system in conjunction with the alignment system. These deflection means 111, 112 are not to be confused with the deflection array means of the PD system 103 which are used to switch selected beamlets of the patterned beam pb "on" or "off", since the former only deal with the particle beam as a whole.

Suitably, a scanning stripe exposure strategy, where the substrate 113 is moved under the incident beam pb, is utilized. It should be noted that, since different parts of the substrate 113 are to be patterned differently, the number of "switched on" apertures changes when the substrate is moved under the patterned beam. At the same time, the current, i.e., the particles traversing the optical column of the lithography apparatus 101 after the absorbing plate 110, may change considerably.

In one typical implementation, the size of the image of an array of apertures in the PD system 138 on the substrate 113 is 80 µm square. The substrate 113 is moved with a velocity of 3 mm/s underneath the patterned beam; so, a completely new area with a—possibly—different pattern is reached roughly every 30 ms. The cycle time of the deflection means is around 5 µs. Consequently, the deflection states of the apertures may change in a matter of microseconds (e.g., from a "switched on" state into a "switched off" state), whereas the patterns on the wafer change in a matter of milliseconds. The optics of the lithography apparatus 101 have to cope with the changing current, i.e., the changing number of particles crossing the optical column.

Figure 2:
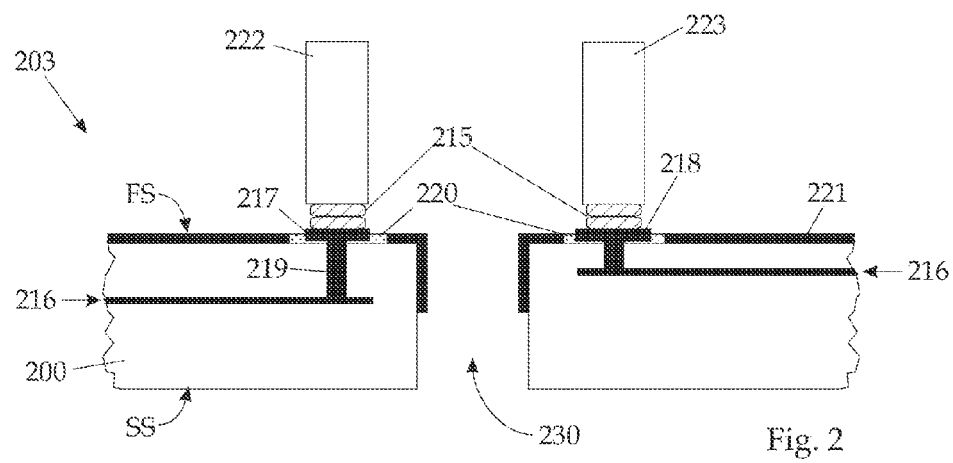
FIG. 2 is a sectional view of a detail of a multi-beam deflector array means according to an embodiment of the invention.

FIG. 2 shows a sectional view of a schematic detail of a multi-beam deflector array means 203 to illustrate the basic concept of the invention. FIGS. 4 to 8 show other, more developed embodiments of the invention. For the sake of clarity, only one of many apertures 230 with its associated electrodes 222, 223 is shown here. Strictly speaking, FIG. 2 depicts a partial view of the membrane region of the main body 200 of the multi-beam deflector array means 203, the apertures 230 being located in said membrane region.

Figure 3:
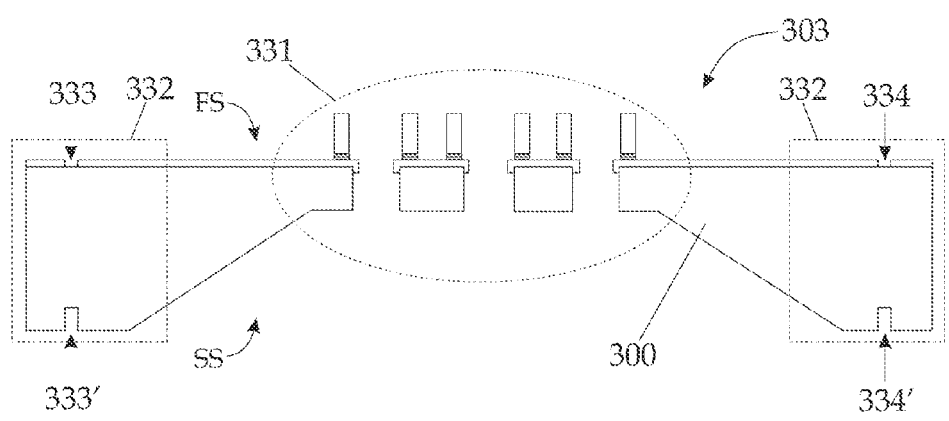
FIG. 3 is a sectional simplified view of the entire main body of a multi-beam deflector array means with a membrane region.

FIG. 3 shows a simplified schematic view of the main body 300 of a multi-beam deflector array means 303 with a membrane region 331 with a number of apertures and their associated electrodes. FIG. 3 is not to scale, furthermore the number of apertures is only three for the sake of clarity.

The main body 300 of the multi-beam deflector array means 303 comprises a wafer with a thickness of around 300 µm. Preferably, it is a "CMOS"-wafer, the term "CMOS" here signifying a wafer having silicon as bulk material, as well as a layer of circuitry beneath the surface, near to one side of the silicon wafer. For the sake of clarity, the layer of circuitry is not shown in FIG. 3. The upper side of the main body 300 of the multi-beam deflector array means 303 is the first side FS facing towards the incoming beam of particles, the opposite side is the second side SS. It is, however, possible for the multi-beam deflector array means 303 to be arranged the other way round so that the second side SS is oriented towards the incoming beam of particles.

The main body 300 features a membrane region 331 in its inner area ("inner" here means offset from the borders of the wafer that forms the main body) where it is thinned by means of appropriate processes. In this membrane region 331, the thickness of the wafer is usually around 50 µm. This means that a multi-beam deflector array means 303 according to the invention usually has a "frame" 332 with a thickness of 300 µm surrounding the membrane region which has a thickness of around 50 µm.

In a realistic implementation the lateral width of the membrane region 331 will be distinctly greater than the lateral width of each frame 332.

In the following, the term "multi-beam deflector array means" always refers to the membrane region of the main body since the FIGS. 4 and 6 all show partial views of said part of the multi-beam deflector array means.

Referring again to FIG. 2, the multi-beam deflector array means 203 is fabricated from a "CMOS"-wafer with one or more layers of circuitry 216. The layer of circuitry 216 is covered by a contact layer and a passivation layer. The term "circuitry" here includes a number of intrinsic layers, e.g., four to 16 or more; not all of these layers are shown here for the sake of clarity. The upper side of the main body 200 of the multi-beam deflector array means 203 in FIG. 2 is the first side FS facing towards the incoming beam of particles, the opposite side is the second side SS.

The apertures 230 of the multi-beam deflector array means 203 in FIG. 2 are located in the membrane region. The diameter of the apertures is around 7 µm, for instance. Two metallic pads 217, 218 are located next to each aperture 230. These pads 217, 218 are connected to the circuitry layer 216 with via contacts 219. Beneath the metallic pads 217, 218 an insulating layer 220 is applied to electrically separate the pads 217, 218 from the wafer. The insulating material may be silicon oxide, for instance.

The first side FS of the wafer is covered with a metallic layer 221, serving as ground layer. The ground layer extends into the aperture 230 and covers a portion of the vertical walls of the aperture 230. The metallic layer is applied using well established methods, e.g., electro-plating or sputtering.

On the metallic pads 217, 218 two electrodes 222, 223, e.g., made of silicon, are arranged, one on each pad 217, 218. The arrangement is accomplished by bonding the electrodes 222, 223 to the main body. This bonding is done using indium bonds 215. However, other forms of bonding as known to anyone skilled in the art or other materials, like copper-tin alloys, may be employed as well. The bonding connection is the only means to hold the electrodes 222, 223 in place. The electrodes 222, 223 are free-standing and mechanically independent from each other, i.e., no connections like ligaments or connection membranes are provided. As explained earlier, the embodiment in FIG. 2 serves to explain the basic principle of the invention and is one of a number of suitable embodiments. In other feasible embodiments, in particular those to be produced industrially, mechanical support for the electrodes may be provided by means of a support plate or the like, as explained further below.

One of the electrodes 222, 223 serves as ground electrode 223 which is connected to the ground potential, the other electrode acts as deflecting or blanking electrode 222. The term "ground potential" in the present disclosure refers to a potential that is used as a common reference potential for the electrodes associated with the individual beamlet deflectors. This ground potential is usually the same as, but may be different from, a ground potential of other electrical systems of a lithography apparatus or other application areas of a pattern definition device.

The electrical field generated by means of the "pillared" electrodes 222, 223 is not confined to the area between the electrodes 222, 223 and affects neighboring apertures. To reduce this effect, adequate shielding of cross talk is necessary, for example by using so-called counter electrodes as described in the U.S. Publication No. 2008/0283767 A1 by the applicant/assignee, the disclosure of which is incorporated by reference herein in its entirety. Another possibility would be to provide a plate that is arranged upstream (if the electrodes 222, 223 are located on the first side FS, facing towards the incoming particle beam(lets)) or downstream (if the electrodes 222, 223 are located on the second side SS) and comprises shielding structures that extend in the spaces between neighboring apertures 230. In this way, the apertures 230 and their respective electrodes 222, 223 are shielded from each other and cross talk is suppressed.

A possible way to produce a setup as depicted in FIG. 2 is as follows. The electrodes 222, 223 are produced from a SOI (silicon on isolator)-wafer using techniques commonly applied in the semiconductor industry. Once the wafer with the electrodes is connected to the main body 200 of the multi-beam deflector array means via bonding connections, the bulk of the SOI-wafer with the electrodes is removed with techniques like etching and grinding, resulting in a setup as depicted in FIG. 2, with free-standing, mechanically independent electrodes 222, 223.

Figure 4:
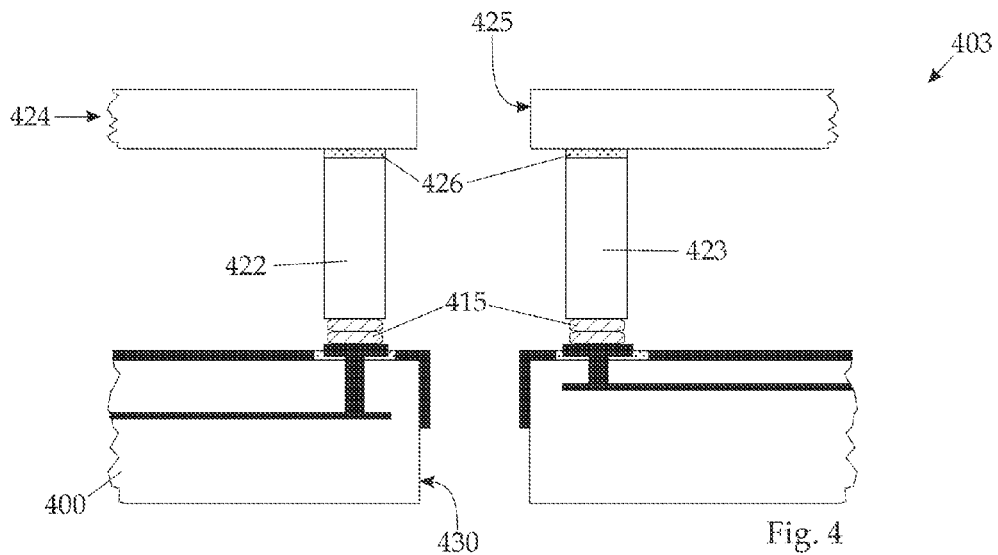
FIG. 4 is a sectional view of another embodiment of the invention with a support plate.

FIG. 4 shows another embodiment of the multi-beam deflector array means 403 according to the invention. The multi-beam deflector array means 403 again comprises a main body 400 with a membrane region featuring a plurality of apertures, of which only one aperture 430 is depicted in FIG. 4 for the sake of simplicity. Each aperture 430 is associated with two electrodes 422, 423 which are connected to the wafer by means of a bonding connection, using indium bonds 415, for instance.

The present embodiment further comprises a support plate 424 which is arranged on top of the electrodes 422, 423, parallel to the main body 400 of the multi-beam deflector array means 403. The support plate 424, which may consist of silicon, has openings 425 corresponding to the apertures 430 in the membrane region of the main body 400. The support plate 424 mechanically supports the electrodes 422, 423. The electrodes 422, 423 are connected with the support plate 424.

The openings 425 in the support plate 424 are usually slightly larger in diameter than the apertures 430. This means that with the apertures 430 having a diameter of around 7 µm, the diameter of the openings 425 is equal to or larger than 7 µm. The walls of the openings 425 are vertical in the embodiment depicted in FIG. 4. Between support plate 424 and electrodes 422, 423 an insulating layer 426, e.g., 300 nm of oxide, is provided to electrically separate the support plate 424 from the electrodes 422, 423.

The openings 425 in the support plate 424 may either be fabricated before the plate is fixed to the electrodes 422, 423 or may be etched after the plate has been bonded to the electrodes. In order to arrive at a good match between the openings 425 of the support plate 424 and the corresponding apertures 430 in the multi-beam deflector array means 403 the alignment marks in the main body of the multi-beam deflector array means 403 can be used. FIG. 3 shows such alignment marks 333, 333', 334, 334', with two upper alignment marks 333, 334 being arranged on the first side FS of the multi-beam deflector array means 303 and their corresponding lower alignment marks 333', 334' being arranged on the second side SS.

In one possible embodiment, the electrodes 422, 423 and the support plate 424 might be produced from one single wafer using methods well known in the field of semiconductors. For instance, a SOI-wafer could be used, and trenches and apertures are fabricated according to the required profile.

In case a setup as depicted in FIG. 4 is used in a PD-system, an aperture plate has to be provided in front of ("in front of" as seen in the direction of the particle beam) the multi-beam deflector array means according to the invention to shape beamlets out of the impinging broad beam of charged particles. It is, however, possible to combine the task of the aperture plate and the task of the support plate into one plate, as it is the case in FIGS. 5, 6 and 7.

Figure 5:
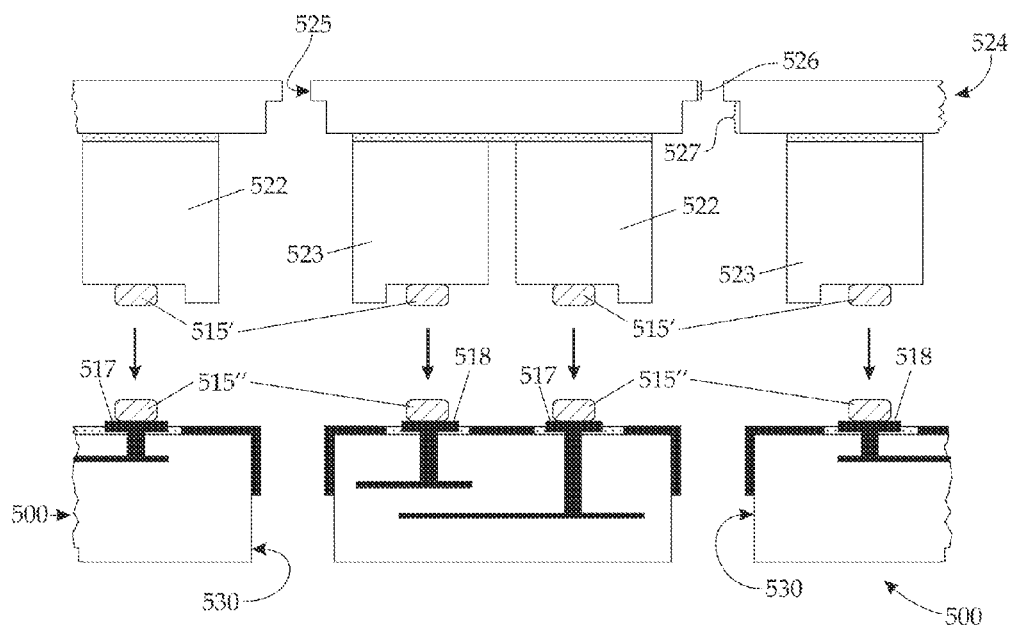
FIG. 5 is a sectional view of yet another implementation of the invention with a modified support plate which serves as aperture plate to the multi-beam deflector array means where the main body and the support plate are separated.
Figure 6:
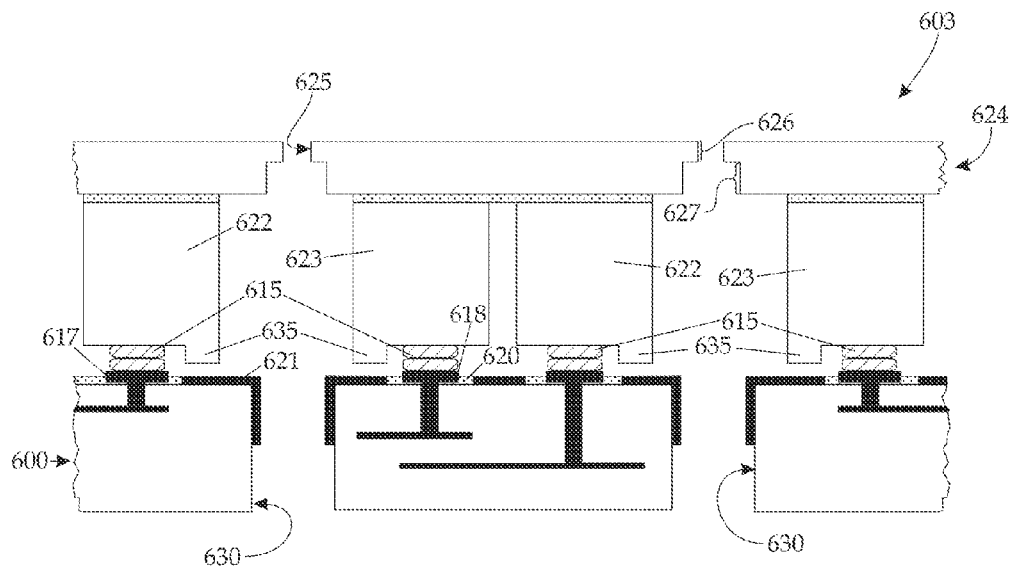
FIG. 6 is the setup of FIG. 5 where the main body and the support plate are connected by means of a bonding connection.

FIGS. 5 and 6 show another embodiment of the invention in two consecutive situations in the process of fabricating a multi-beam deflector array means, namely the main body 500, 600 of the multi-beam deflector array means and the support/aperture plate before (FIG. 5) and after (FIG. 6) bonding.

In the embodiment of FIGS. 5 and 6, the support plate 524, 624 also acts as aperture plate, defining the beamlets out of the impinging beam of energetic charged particles. Therefore, the openings 525, 625 in the support plate 524, 624 are smaller in diameter than the apertures 530, 630 in the main body of the multi-beam deflector array means. Thus, the impinging particle beam is split up into beamlets at the support/aperture plate 524, 624 and pervade the openings 525, 625 and apertures 530, 630 without hitting the main body of the multi-beam deflector array means.

The walls of the openings in the support plate 524, 624 are cascaded in the embodiment of FIGS. 5 and 6, the upper part 526, 626 (i.e., the part that is oriented towards the incoming beam) having a smaller diameter (around 3.75 µm, for instance) than the lower part 527, 627 of the wall. By this measure the diameter of the beamlet pervading the multi-beam deflector array means 503, 603 is smaller than the diameter of the subsequent openings/apertures, so, the energetic particles of the beamlet do not damage the subsequent structures. Naturally, the cascaded structure of FIGS. 5 and 6 is only one possible variant and is not intended to constitute any limitation to the invention.

FIG. 5 shows a situation where the main body 500 of the multi-beam deflector array means and the support plate 524 (support-aperture plate, respectively) are still separate from each other. Preceding the bonding connection between the main body 500 and the support plate 524, indium bumps 515', 515" are provided on the metallic pads 517, 518 on the main body 500 and on the electrodes 522, 523.

The bumps 515', 515" can be produced by depositing the bonding material on the entire surface of the main body 500 and support plate 524 and removing the material everywhere except on the locations where the bumps 515', 515" are to be situated. Other methods to apply bonding bumps 515', 515" are well established and can be implemented by the person skilled in the art.

The support plate 524 depicted in FIG. 5 can be produced from a customary SOI-wafer. Trenches are etched into the silicon until the layer of oxide in order to produce the electrodes 523, 522 insulated from each other. The openings 525 can be produced using the same methods. In principle it would also be possible to remove the support plate 524 using etching techniques to arrive at a setup as depicted in FIG. 2. However, the setup of FIG. 4 (and FIGS. 5 and 6) is more favourable due to its increased mechanical support to the electrodes.

The support plate 524 and the main body 500 are connected with each other by moving them in the direction of the vertical arrows in FIG. 5, resulting in the setup of FIG. 6.

The bonding connection has to be established with low pressure and low temperatures (preferably below 300° C., depending on the thermal stability of the pre-processed plates and structures) in order to protect the structures in and on the main body 600 and the support plate 624. By connecting the indium bumps 515', 515" with each other, indium bonds 615 are established, connecting the main body 600 and the electrodes 622, 623 mechanically and conductively.

The shape of the electrodes 622, 623 slightly differs from the shape of the electrodes of FIGS. 2 and 4. In FIG. 6, the electrodes 622, 623 have protrusions 635 (also referred to as "noses") on their lower ends on the side next to the apertures 630. The term "lower end" used here is to be understood in connection with the arrangement of FIG. 6 and describes the ends of the electrodes 622, 623 that are oriented away from the support plate 624 and towards the main body 600 of the multi-beam deflector array means 603.

Even though the protrusions 635 approximate the main body 600 very closely, there still remains a gap between electrode and main body.

The protrusions 635 serve as additional shielding of the beamlet transgressing the device against stray fields. The insulating layer 620 between the metallic pads 617, 618 and the main body 600 has generally a not well defined surface potential and can get charged by stray particles from the beamlet of charged particles transgressing the device—this electrostatic disturbance or charge could easily affect the proper functioning of the electrodes 622, 623. Hence the protrusions 635 to shield the beamlet from the insulating layer 620. Care has to be taken not to bring the protrusions too closely to the metallic layer 621 to prevent a short cut or leakage current.

Figure 7:
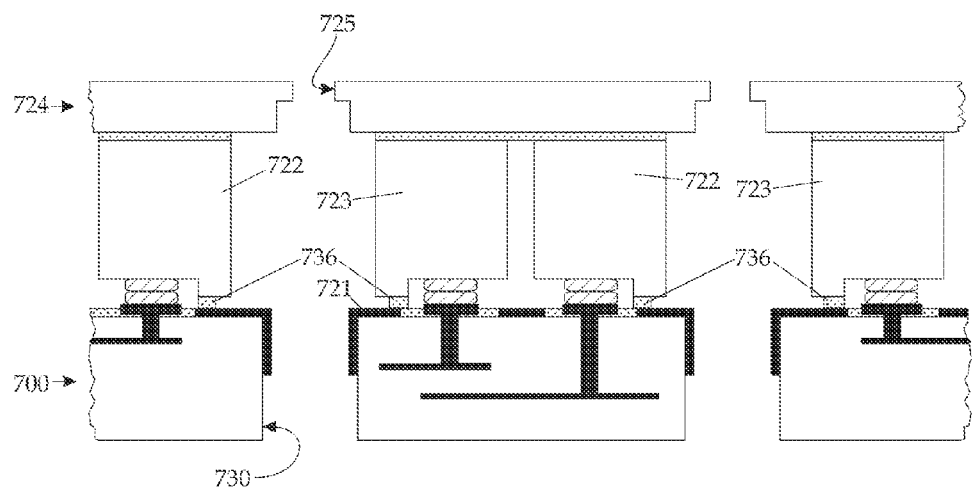
FIG. 7 is a sectional view of another embodiment of the invention.

FIG. 7 shows a setup similar to FIG. 6; however, in FIG. 7 an isolating coating 736 is applied to the electrodes 722, 723, namely on the side directed towards the main body 700. When the bonding connection between support plate 724 and main body 700 is established, the two parts are brought together until the isolating coating 736 sits solidly on the metallic layer 721 of the main body 700. Thus, an equivalent shielding of the beamlet transgressing the openings 725 (in the support plate 724) and apertures 730 (in the main body 700) of the device is achieved, while at the same time it is guaranteed that no electric short-circuit is produced between the electrodes and the main body after bonding.

In principle, the isolating coating 736 may also be applied to the main body 700. In this case, the bonding connection can be established as described in the previous paragraph—the electrodes 722, 723 themselves do not have an isolating coating 763 but sit on the isolating coating 736 applied on the main body 700.

The isolating coating 736 is retracted from the apertures 730 and the side of the electrodes 723, 723 facing the aperture 730, respectively. This is done in order to prevent charging of the isolating coating 736 by stray particles from the transgressing beamlets.

Figure 8:
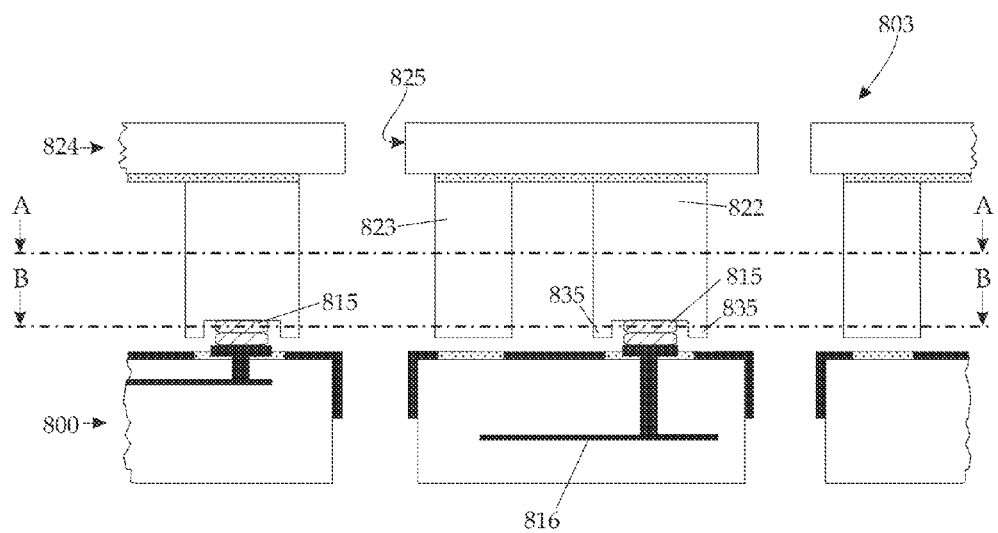
FIG. 8 is another embodiment of the invention in a sectional view.

Yet another embodiment of the invention is depicted in FIG. 8. Here, only one blanking electrode 822 is connected to the main body 800 via a bonding connection 815. The protrusion 835 of this blanking electrode 822 extends all around the circumference of the lower end of the blanking electrode 822, "lower end" here again signifying the end of the electrode that is directed towards the main body 800 of the multi-beam deflector array means 803. The second electrode 823 serves as ground electrode. It is connected to the ground potential via the support plate 824 (connection not shown in FIG. 8—see FIG. 10) and, as a consequence, does not have to be connected to the main body 800 and its circuitry 816 by means of a bonding connection at the location of the electrode.

Typically, every ground electrode is connected to the CMOS element that switches the deflection electrode to the local CMOS ground potential (e.g., by flip-flop), for example, by a bonding element near that electrode. An example of such a connection can be seen in FIG. 10 (offset bonding connection 1037—see also discussion of FIG. 10 below). By this, undesired "ground bouncing", i.e., electrical noise on the ground signal during CMOS-operation, would affect the ground electrode and the deflection electrode in the same way, and therefore not cause angular errors by slight deflections in the state where the beam is switched on (both electrodes are on the same potential, even in case of ground bouncing).

The vertical shaping of the flanks of the openings 825 in the support plate 824 are vertical unlike in FIGS. 5, 6 and 7.

Figure 9:
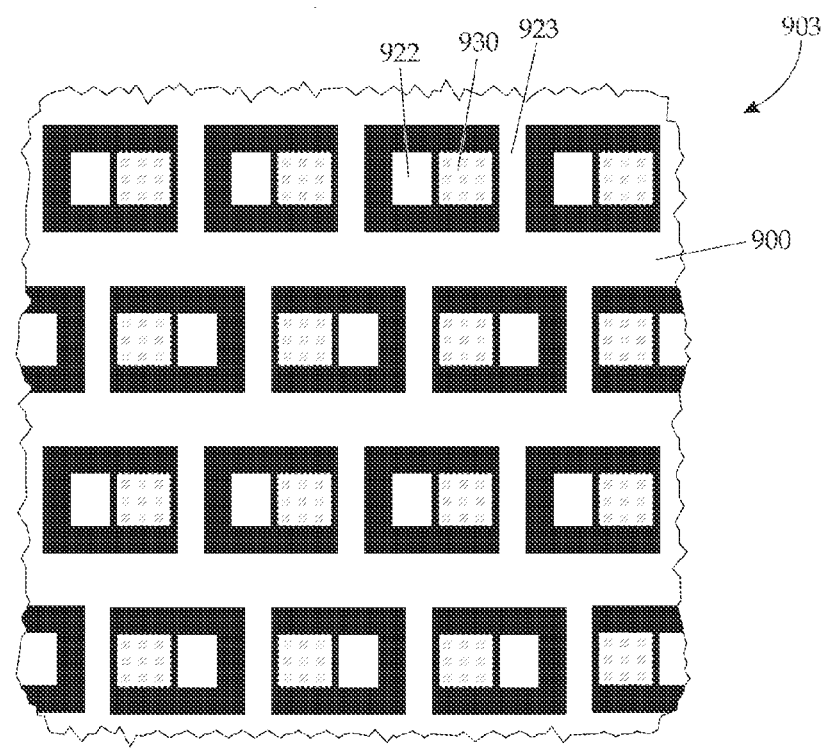
FIG. 9 is a plan view of the embodiment of FIG. 8 along line A-A.
Figure 10:
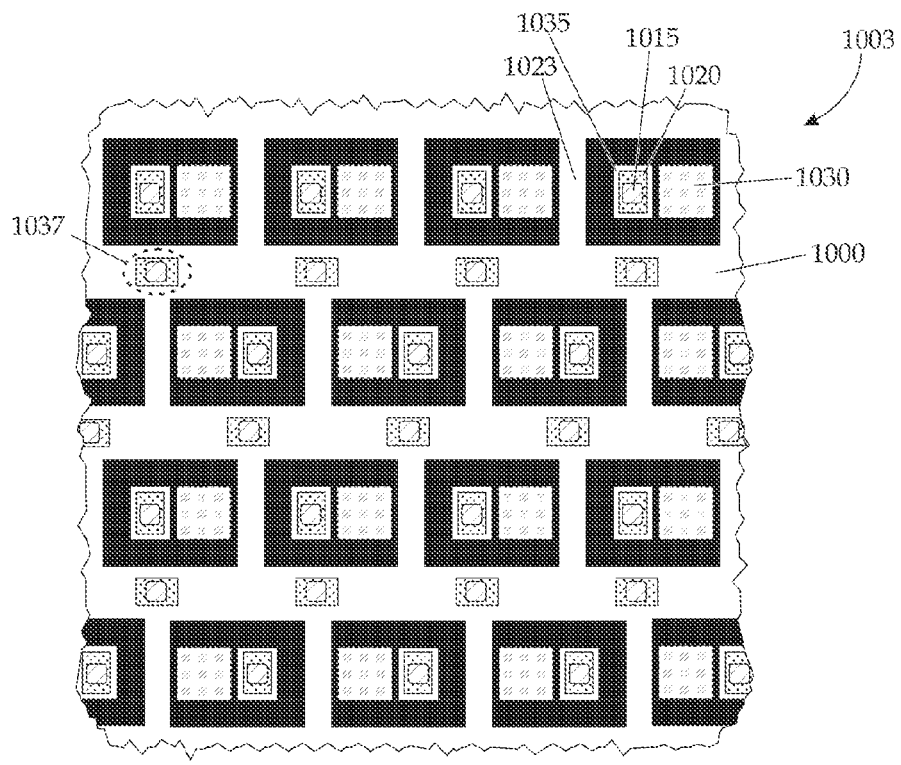
FIG. 10 is a plan view of the embodiment of FIG. 8 along line B-B.

FIGS. 9 and 10 show sectional views of the setup in FIG. 8 along the lines A-A (FIG. 9) and B-B (FIG. 10) in FIG. 8.

It is remarked that the proportions in FIGS. 2 to 8 are not to scale for the sake of comprehensibility. FIGS. 9 and 10 show more realistic ratios. Even though FIGS. 9 and 10 show sectional views of FIG. 8 they do not exhibit identical proportions and relations as FIG. 8.

FIG. 9 shows a plurality of sets of electrodes 922, 923 being arranged next to apertures 930 in a fragment of the main body 900 of a multi-beam deflector array means 903. For the sake of visibility, the apertures 930 are marked with a pattern of small lines—id clear that the apertures 930 extend through the main body 900 and are, in fact, see-through.

The features of the invention are explained by one set of electrodes, but this information is valid for all other sets in FIG. 9 as well. In FIG. 9 it is shown that the blanking electrode 922 is fabricated as a stand-alone pillar, whereas the ground electrode 923 is more like a ligament.

The sectional view of FIG. 10 dissects the multi-beam deflector array means 1003 on the level of the bonding connections 1015. It can be seen that on this level, the blanking electrode exhibits only the protrusion 1035 that is formed on the outer boundary of the electrode. Inside of the protrusion 1035 is the bonding connection 1015. The bonding connection 1015 is arranged on a metallic pad (not shown in FIG. 10) that is surrounded by an insulating layer 1020. Again, the aperture 1030 is marked with a pattern of small lines.

FIG. 10 further shows the connection of the ground electrodes 1023 to the ground potential. For that means, offset bonding connections 1036 are provided between the sets of electrodes 1022, 1023 and openings 1030. A sufficient number of such offset bonding connections 1037 may be provided not too far from their respective set of electrodes 1022, 1023—the potential may vary over the surface of the main body 1000, potentially resulting in malfunctions of the system.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

LIST OF REFERENCE SIGNS 200, 300, 400, 500, 600, 700, 800, 900 main body
101 lithography apparatus
102 illumination system
203, 403, 803, 903, 1003 multi-beam deflector array means
104 projecting system
105 target station
106 electrostatic or electromagnetic lens
107 electron gun
108 extraction system
109 condenser lens system
109a general blanking deflector
110 absorbing plate
111 first deflection means
112 second deflection means
113 substrate
114 wafer stage
215, 415, 815, 1015 indium bonds
515', 515" bump
216, 816 layer of circuitry
217, 218, 517, 518, 617, 618 metallic pads
219 via contact 220, 1020 insulating layer
221, 721 metallic layer
222, 422, 522, 622, 722, 822, 922, 1022 blanking electrode
223, 423, 523, 623, 723, 823, 923, 1023 ground electrode
424, 524, 624, 724, 824 support plate
425, 525, 625, 725, 825 openings
326 insulating layer
426 upper part
527, 627 lower part
130, 230, 430, 530, 630, 930, 1030 aperture
331 membrane region
332 frame
333, 334 upper alignment marks
333', 334' lower alignment marks
635, 835, 1035 protrusion
736 isolating coating
1037 offset bonding connection
138 pattern definition (PD)-system
c1, c2 crossover
cx optical axis
FS first side
SS second side
lb lithography beam
pb patterned beam

We claim:

1. A multi-beam deflector array means for use in a particle-beam exposure apparatus employing a beam of charged particles, said multi-beam deflector array means comprising a main body of overall plate-like shape having a membrane region and a buried CMOS-layer, said membrane region comprising:
   a first side facing towards the incoming beam of particles and a second side opposite to the first side;
   an array of apertures, each aperture allowing passage of a corresponding beam element formed out of said beam of particles; and
   an array of electrodes, each aperture being associated with at least one of said electrodes and the electrodes being controlled via said CMOS layer;
   wherein the electrodes are pillared, not located within depressions in the main body of the multi-beam deflector array means, the electrodes being connected to one of the first side and the second side of the main body of the multi-beam deflector array means by means of bonding connections; and
   wherein the electrodes with the bonding connections are produced by:
      depositing bonding material on the surface of the main body;
      connecting a wafer with the electrodes to the main body by a wafer bonding method; and
      removing a portion of said wafer with the electrodes from the main body of the multi-beam deflector array means.

2. The multi-beam deflector array means of claim 1, wherein indium is used to realise the bonding connection between the electrodes and the multi-beam deflector array means.

3. The multi-beam deflector array means of claim 1, wherein the electrodes are made of silicon.

4. The multi-beam deflector array means of claim 1, wherein the top area of the electrodes, top signifying the end of the electrodes that is directed towards the main body, is larger than the area used by the bonding connection.

5. The multi-beam deflector array means of claim 4, wherein protrusions are present on the outer boundary of the top area of the electrodes, a protrusion being an area that is elevated relative to the remaining area of the top of the electrodes.

6. The multi-beam deflector array means of claim 5, wherein the protrusions are restricted to the part of the top of the electrode oriented toward the respective apertures of the main body.

7. The multi-beam deflector array means of claim 5, wherein an isolating coating is applied to the top of the protrusion.

8. The multi-beam deflector array means of claim 5, wherein an isolating coating is applied to the side of the main body facing the electrodes, the isolating coating being located at the places where the protrusions touch on the main body.

9. The multi-beam deflector array means of claim 7, wherein the isolating coating is retracted from the side of the protrusion facing the respective aperture in the main body of the multi-beam deflector array means.

10. The multi-beam deflector array means of claim 1, wherein the electrodes are mechanically independent from each other.

11. The multi-beam deflector array means of claim 1, further comprising a support plate arranged on the side of the electrodes facing away from the main body such that the support plate is separated from the main body by the electrodes, the support plate being connected with the electrodes and an insulating layer electrically isolating the support plate from the electrodes, the support plate comprising an array of openings which correspond to the apertures of the main body.

12. The multi-beam deflector array means of claim 11, wherein the diameter of the openings of the support plate is equal to or larger than the diameter of the apertures of the main body.

13. The multi-beam deflector array means of claim 11, wherein the support plate acts as aperture plate with the openings of the aperture plate exhibiting a smaller diameter than the subsequent apertures in the main body.

14. The multi-beam deflector array means of claim 11, wherein an upper part of the wall of the openings in the support plate has a smaller diameter than a lower part of the wall and the subsequent aperture in the main body.

15. The multi-beam deflector array means of claim 1, wherein the electrodes are arranged on the first side of the main body of the multi-beam deflector array means.

16. The multi-beam deflector array means of claim 1, wherein the electrodes are arranged on the second side of the main body of the multi-beam deflector array means.

* * * * *